US009660125B2

United States Patent
Plesniak et al.

(10) Patent No.: US 9,660,125 B2
(45) Date of Patent: May 23, 2017

(54) METHOD OF MAKING A MODULAR OFF-AXIS SOLAR CONCENTRATOR

(71) Applicant: The Boeing Company, Chicago, IL (US)

(72) Inventors: Adam P. Plesniak, Huntington Beach, CA (US); John C. Hall, Rancho Palos Verdes, CA (US)

(73) Assignee: The Boeing Company, Chicago, IL (US)

( * ) Notice: Subject to any disclaimer, the term of this patent is extended or adjusted under 35 U.S.C. 154(b) by 74 days.

(21) Appl. No.: 14/606,316

(22) Filed: Jan. 27, 2015

(65) Prior Publication Data

US 2015/0135536 A1  May 21, 2015

Related U.S. Application Data

(62) Division of application No. 12/632,268, filed on Dec. 7, 2009, now Pat. No. 8,940,999.

(51) Int. Cl.
*H01L 31/054* (2014.01)
*H01L 31/052* (2014.01)
(Continued)

(52) U.S. Cl.
CPC ........ *H01L 31/0547* (2014.12); *F24J 2/1057* (2013.01); *F24J 2/50* (2013.01);
(Continued)

(58) Field of Classification Search
CPC . H01L 31/0522; H01L 31/052; H01L 31/054; H01L 31/0547; F24J 2/06;
(Continued)

(56) References Cited

U.S. PATENT DOCUMENTS

| 4,150,663 A | 4/1979 | Sisson |
| 4,223,174 A | 9/1980 | Moeller |

(Continued)

FOREIGN PATENT DOCUMENTS

| DE | 102006009412 | 8/2007 |
| EP | 1835547 | 9/2007 |
| WO | 2007/117136 | 10/2007 |

OTHER PUBLICATIONS

Plesniak, A. et al., "High Performance Concentrating Photovoltaic Module Designs for Utility Scale Power Generation," submitted for the PVSC34 Proceedings, Jun. 7-12, 2009, and SPIE Optics and Photonics, Aug. 2-6, 2009.

(Continued)

*Primary Examiner* — Devina Pillay
(74) *Attorney, Agent, or Firm* — Thompson Hine LLP

(57) ABSTRACT

A method of making a solar concentrator may include forming a receiving wall having an elongated wall, a first side wall and a second side wall; attaching the first side wall and the second side wall to a reflecting wall to form a housing having an internal volume with an opening; forming a lip on the receiving wall and the reflecting wall; attaching a cover to the receiving wall and the reflecting wall at the lip to seal the opening into the internal volume, thereby creating a rigid structure; and mounting at least one receiver having at least one photovoltaic cell on the elongated wall to receive solar radiation entering the housing and reflected by the receiving wall, the receiver having an axis parallel with a surface normal of the photovoltaic cell, such that the axis is disposed at a non-zero angle relative to the vertical axis of the opening.

19 Claims, 6 Drawing Sheets

(51) Int. Cl.
*F24J 2/10* (2006.01)
*F24J 2/50* (2006.01)
*F24J 2/08* (2006.01)
*F24J 2/14* (2006.01)
*F24J 2/46* (2006.01)

(52) U.S. Cl.
CPC .......... *H01L 31/052* (2013.01); *H01L 31/054* (2014.12); *F24J 2/08* (2013.01); *F24J 2/14* (2013.01); *F24J 2002/1085* (2013.01); *F24J 2002/4692* (2013.01); *Y02E 10/40* (2013.01); *Y02E 10/52* (2013.01); *Y10T 29/49355* (2015.01)

(58) Field of Classification Search
CPC .......... F24J 2/08; F24J 2/10; F24J 2/12; F24J 2/464; F24J 2/5243; F24J 2/50; F24J 2/1057; F24J 2002/4692; F24J 2002/1085; F24J 2/14; Y02E 10/25; Y02E 10/45; Y02E 10/52; Y10T 29/49355
USPC .......................................................... 136/246
See application file for complete search history.

(56) References Cited

U.S. PATENT DOCUMENTS

| | | | |
|---|---|---|---|
| 4,350,837 A | 9/1982 | Clark | |
| 4,683,348 A * | 7/1987 | Pidgeon | F24J 2/06 136/246 |
| 5,096,505 A | 3/1992 | Fraas et al. | |
| 5,180,441 A | 1/1993 | Cornwall et al. | |
| 5,255,666 A | 10/1993 | Curchod | |
| 5,344,496 A | 9/1994 | Stern et al. | |
| 5,409,550 A | 4/1995 | Safir | |
| 6,641,287 B2 | 11/2003 | Suehiro | |
| 2003/0063888 A1 | 4/2003 | Sahlin et al. | |
| 2003/0075212 A1 | 4/2003 | Chen et al. | |
| 2006/0185713 A1 | 8/2006 | Mook | |
| 2006/0193066 A1 | 8/2006 | Prueitt | |
| 2006/0266408 A1 | 11/2006 | Horne et al. | |
| 2007/0227573 A1 * | 10/2007 | Hunter | F24J 2/465 136/206 |
| 2008/0185040 A1 | 8/2008 | Tom et al. | |
| 2008/0223443 A1 | 9/2008 | Benitez et al. | |
| 2008/0251113 A1 * | 10/2008 | Horne | H01L 31/0547 136/246 |
| 2008/0308152 A1 | 12/2008 | Grip | |
| 2010/0037936 A1 | 2/2010 | Becker et al. | |
| 2010/0275972 A1 * | 11/2010 | Benitez | F24J 2/08 136/246 |

OTHER PUBLICATIONS

Plesniak, A., Oral Presentation entitled "High Performance Concentrating Photovoltaic Module Designs for Utility Scale Power Generation," PVSC34 Proceedings, Jun. 7-12, 2009, and SPIE Optics and Photonics, Aug. 2-6, 2009.
Plesniak, A., Oral Presentation entitled "Demonstration of High Performance Concentrating Photovoltaic Module Designs for Utility Scale Power Generation," presented at ICEPAG 2009 (Feb. 10-12, 2009).
Plesniak, A., Poster panel entitled, "Demonstration of High Performance Concentrating Photovoltaic Module Designs for Utility Scale Power Generation," presented at ICSC5 (Nov. 16-19, 2008).
DeScioli, D., "Soliant Energy," Soliant Energy, Inc. (24 pages) (2007).
Product literature, "Sunflower. Fully-Integrated, Smart CPV," by Energy Innovations, Inc. (2 pages) (2008).
Pillay, Devina; Non-Final Office Action; U.S. Appl. No. 12/632,268; Apr. 26, 2012; U.S. Patent and Trademark Office; Alexandria, VA.
Pillay, Devina; Final Office Action; U.S. Appl. No. 12/632,268; Aug. 16, 2012; U.S. Patent and Trademark Office; Alexandria, VA.
Pillay, Devina; Non-Final Office Action; U.S. Appl. No. 12/632,268; May 29, 2014; U.S. Patent and Trademark Office; Alexandria, VA.
Pillay, Devina; Notice of Allowance; U.S. Appl. No. 12/632,268; Sep. 17, 2014; U.S. Patent and Trademark Office; Alexandria, VA.

* cited by examiner

METHOD OF MAKING A MODULAR OFF-AXIS SOLAR CONCENTRATOR

CLAIM FOR BENEFIT OF PRIOR-FILED NON-PROVISIONAL APPLICATION

This application is a divisional of, and under 35 U.S.C. §120 claims the benefit of, U.S. Ser. No. 12/632,268 filed Dec. 7, 2009.

STATEMENT REGARDING FEDERALLY SPONSORED RESEARCH

The inventions disclosed herein were made with the support of the government of the United States pursuant to contract number DE-FC36-07G017052 awarded by the Department of Energy. Therefore, the government of the United States may have certain rights in the disclosed inventions.

TECHNICAL FIELD

The present patent application relates to concentrating photovoltaic solar power systems and, more particularly, to solar concentrators having a modular housing, wherein the primary optical elements are at least partially defined by the modular housing.

BACKGROUND

Photovoltaic solar concentrators typically are used to generate electrical power by concentrating sunlight onto photovoltaic devices, thereby collecting sunlight from a large area and concentrating it on a relatively small area of solar cells. Therefore, high efficiency solar cells, such as gallium arsenide-based ("GaAs") solar cells, may be used in place of less efficient silicon solar cells, thereby producing more energy per unit area and, potentially, at a reduced cost.

Solar concentrators may be configured in various ways and typically include only refracting optics, only reflecting optics or any reasonable combination of refracting and reflecting optics. Regardless of the concentrating optics used, excess heat must be managed at the solar cell and the solar cell must be protected from the environment. Therefore, the design process generally requires a compromise between the thermal and/or protective features.

Furthermore, efficient operation of solar concentrators requires precise alignment of the optical elements with the solar cells. Indeed, a more precise alignment enables a higher degree of optical concentration, thereby reducing the aggregate solar cell cost. However, prior art solar concentrator designs typically require costly manufacturing steps to achieve precise alignment, while others sacrifice precision, and therefore efficiency, to reduce manufacturing costs.

Accordingly, there is a need for a solar concentrator that precisely aligns the primary optical elements with the solar cells in an off-axis configuration, while providing the solar cells with the requisite thermal and environmental protections.

SUMMARY

In one aspect, the disclosed method of making a solar concentrator may include forming a receiving wall from a polymeric material with a reflective material incorporated therein for protection from exposure to concentrated sunlight, the receiving wall having an elongated wall, a first side wall extending from a first end of the elongated wall, and a second side wall extending from a second end of the elongated wall; forming a reflecting wall from an optically clear material and having a parabolic contour; attaching the receiving wall to the reflecting wall to form a housing having an internal volume with an opening into the internal volume, the opening having a vertical axis, such that the first side wall and the second side wall of the receiving wall are connected to the reflecting wall; forming a lip on the receiving wall and the reflecting wall; attaching a cover to the receiving wall and the reflecting wall at the lip to seal the opening into the internal volume, thereby creating a rigid structure; and mounting at least one receiver having at least one photovoltaic cell on the elongated wall of the receiving wall to receive solar radiation entering the housing through the opening and reflected by the receiving wall, the receiver having an axis parallel with a surface normal of the photovoltaic cell, such that the axis is disposed at a non-zero angle relative to the vertical axis of the opening.

In another aspect, the disclosed method of making a solar concentrator may include forming a receiving wall from a polymeric material with a reflective material incorporated therein for protection from exposure to concentrated sunlight, the receiving wall having an elongated wall, a first side wall extending from a first end of the elongated wall, and a second side wall extending from a second end of the elongated wall; forming a reflecting wall from an optically clear material, the primary wall having a parabolic contour and defining a plurality of primary optical elements; forming a modular housing by attaching the first side wall and the second side wall of the receiving wall to the reflecting wall to define an elongated trough having an internal volume with an opening into the internal volume, the opening having a vertical axis; forming an upper lip on the elongated housing surrounding the opening into the internal volume; providing a cover attached to the receiving wall and the reflecting wall at the upper lip to seal the opening into the internal volume, thereby creating a rigid structure; and mounting an array of receivers on the elongated wall to receive solar radiation entering the housing through the opening and reflected by the plurality of primary optical elements, each receiver of the array of receivers having an axis parallel with a surface normal of the receiver, such that the axis is disposed at a non-zero angle relative to the vertical axis of the opening.

In yet another aspect, the disclosed method of making a solar concentrator may include forming a housing consisting of a receiving wall and a reflecting wall, the reflecting wall having a plurality of parabolic optical elements formed as an array of parabolic contours in the reflecting wall, the receiving wall and the reflecting wall together defining an internal volume, the housing having an opening into the internal volume; providing the receiving wall with an elongated wall, the receiving wall including a first end and a second end, a first side wall extending from the first end and a second side wall extending from the second end, the first side wall and the second side wall connected directly to the reflecting wall, the receiving wall and the reflecting wall defining a lip; mounting a plurality of receivers on the receiving wall positioned to receive solar radiation entering the housing through the opening and reflected by the receiving wall, the plurality of receivers each receiving incoming sunlight from the plurality of parabolic optical elements; and connecting a cover to the lip to seal the opening into the internal volume, thereby creating a rigid structure that ensures proper optical alignment between the receiving wall and the reflecting wall, the cover secured to the lip by a selected one of adhesives, tape, and mechanical fasteners.

Other aspects of the disclosed solar concentrator and method of making a solar concentrator will become apparent from the following description, the accompanying drawings and the appended claims.

DETAILED DESCRIPTION

Figure 1:
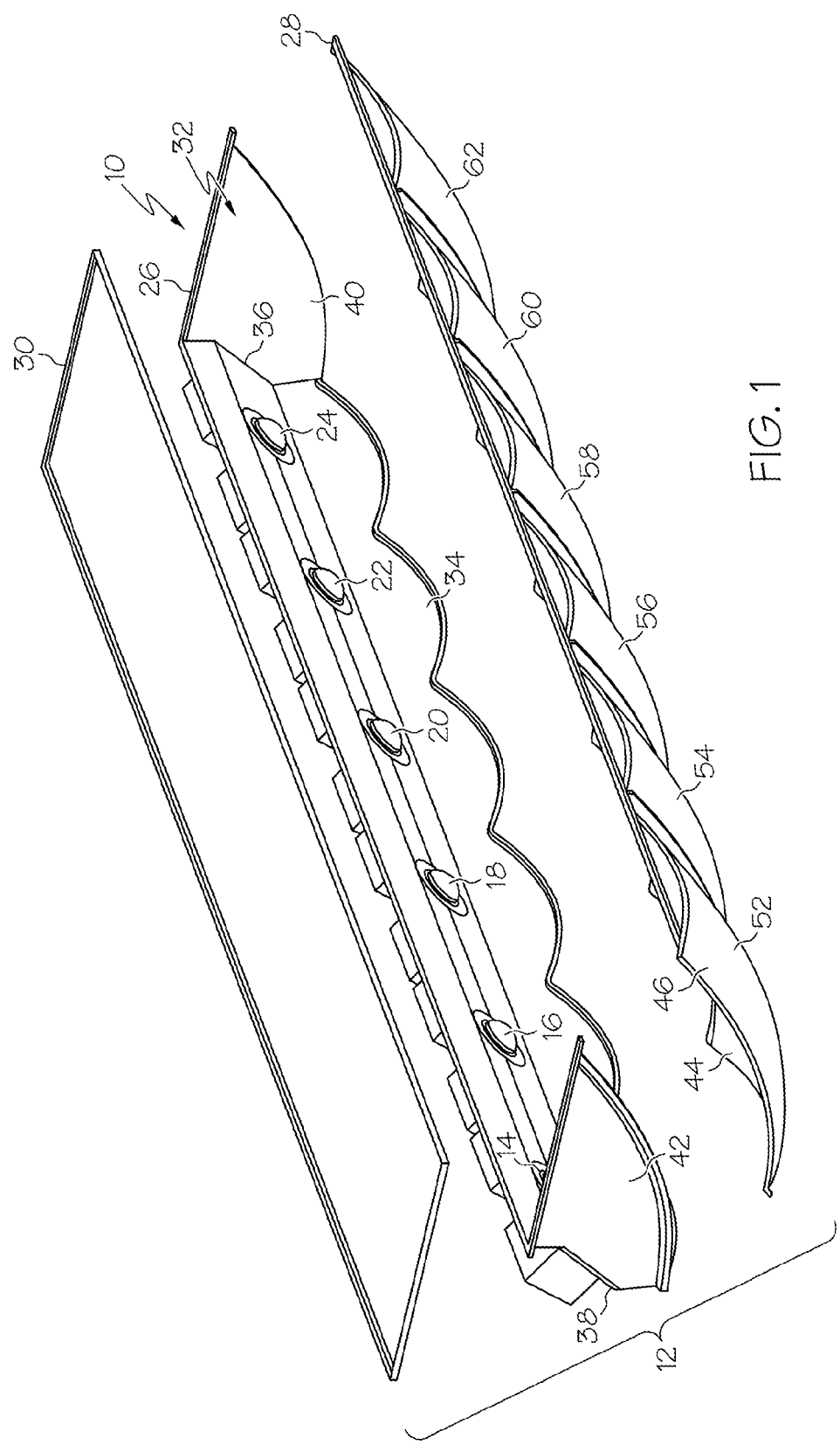
FIG. 1 is an exploded front perspective view of one aspect of the disclosed solar concentrator.

As shown in FIG. 1, one aspect of the disclosed solar concentrator, generally designated 10, may include a housing 12 and an array of receivers 14, 16, 18, 20, 22, 24 supported by the housing 12. The housing 12 may be a modular housing comprised of a receiving wall 26, a reflecting wall 28 and, optionally, a cover 30. The receiving wall 26, the reflecting wall 28 and the cover 30 may be assembled and connected together, e.g., with mechanical fasteners, adhesives and/or welds, to define an internal volume 32. The internal volume 32 may be fully enclosed by the housing 12.

The receiving wall 26 may include an elongated wall 34 that supports the receivers 14, 16, 18, 20, 22, 24, and that includes a first end 36 and a second end 38. A first side wall 40 may extend from the first end 36 of the elongated wall 34 and a second side wall 42 may extend from the second end 38 of the elongated wall 34. The receiving wall 26 may be formed from a polymeric material, such as polyethylene, polycarbonate or acrylic, using an injection molding process or a vacuum forming process, as is well known in the art. Alternatively, the receiving wall 26 may be formed from sheet metal using a deep draw, stamping process plus a break form process.

In the event that the receiving wall 26 is formed from a polymeric material, the receiving wall 26 may be protected from exposure to concentrated sunlight. In one example, a metallic, reflective light shield (not shown) may be positioned on the inside surface of the receiving wall 26 proximate the receivers 14, 16, 18, 20, 22, 24. In another example, a highly reflective material, such as titanium dioxide, may be incorporated into the polymeric material that forms the receiving wall 26.

Furthermore, the wiring (not shown) within the housing 12 may be protected from exposure to concentrated sunlight. In one example, the wiring may be positioned behind a light shield. In another example, the wiring may be bare or may be coated with a light resistant material, such as ceramic cloth or polymer loaded with a reflective material (e.g., titanium dioxide).

Figure 2:
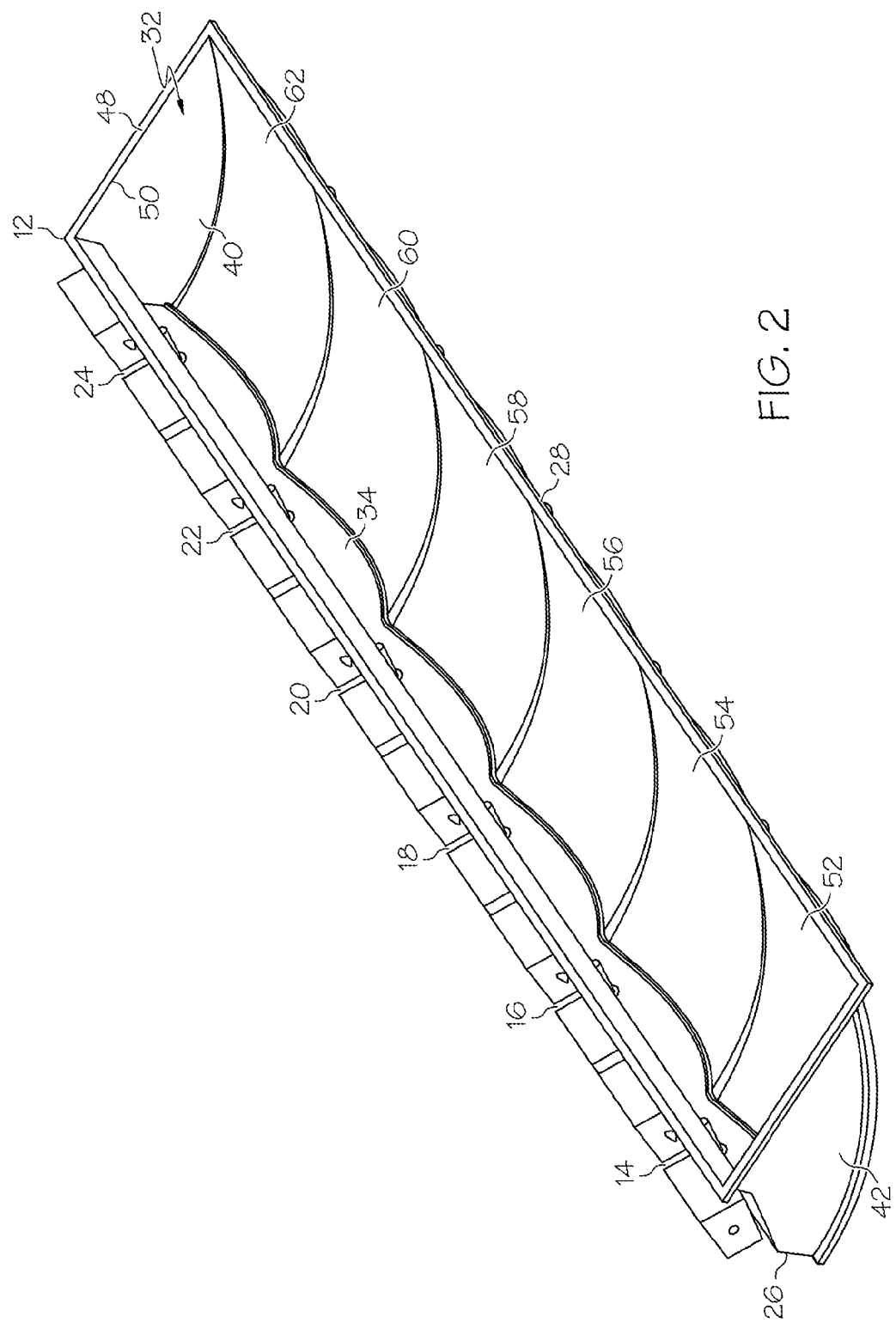
FIG. 2 is a top perspective view of the solar concentrator of FIG. 1, shown in a partially assembled configuration.

As shown in FIG. 1, the reflecting wall 28 may be elongated and may include an internal surface 44 and an external surface 46. Optionally, the reflecting wall 28 may be constructed from multiple separate segments that have been connected together. As shown in FIG. 2, the reflecting wall 28 may be connected to the receiving wall 26 to define an elongated trough having an upper lip 48 surrounding an opening 50 into the internal volume 32 of the housing 12. Like the receiving wall 26, the reflecting wall 28 may be formed from a polymeric material using an injection molding process or a vacuum forming process, or from sheet metal using a deep draw, stamping process plus a break form process.

In accordance with a first aspect, the reflecting wall 28 may define primary optical elements 52, 54, 56, 58, 60, 62. The primary optical elements 52, 54, 56, 58, 60, 62 may be sized, shaped and sufficiently reflective to receive incoming sunlight and direct the incoming sunlight to the associated receivers 14, 16, 18, 20, 22, 24. Those skilled in the art will appreciate that the overall size, shape and geometry of the primary optical elements 52, 54, 56, 58, 60, 62 may depend on the overall size and shape of the housing 12, as well as the positioning of the receivers 14, 16, 18, 20, 22, 24 within the housing 12, among other things.

Figure 3:
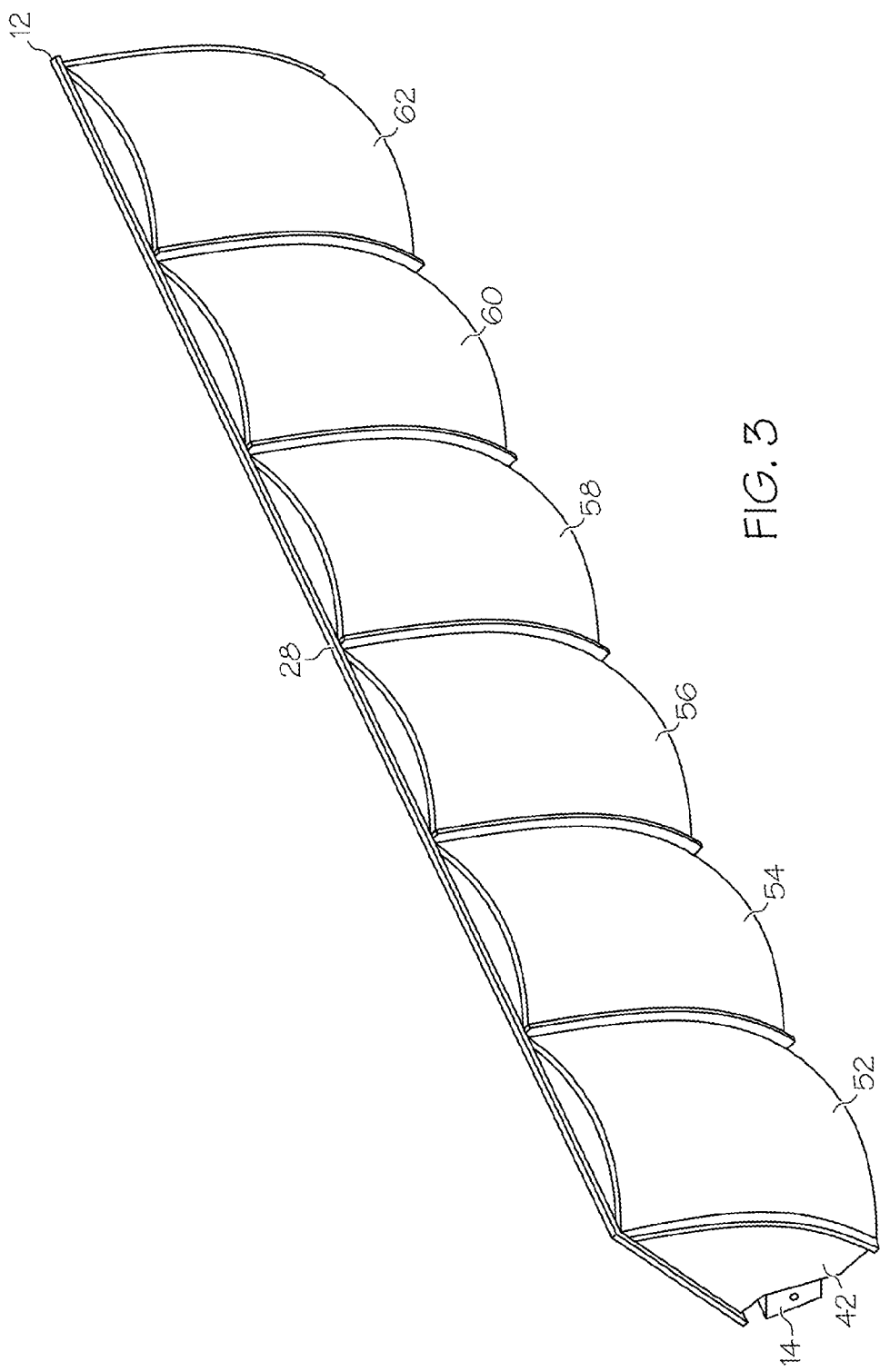
FIG. 3 is a bottom perspective view of the solar concentrator of FIG. 2.
Figure 5:
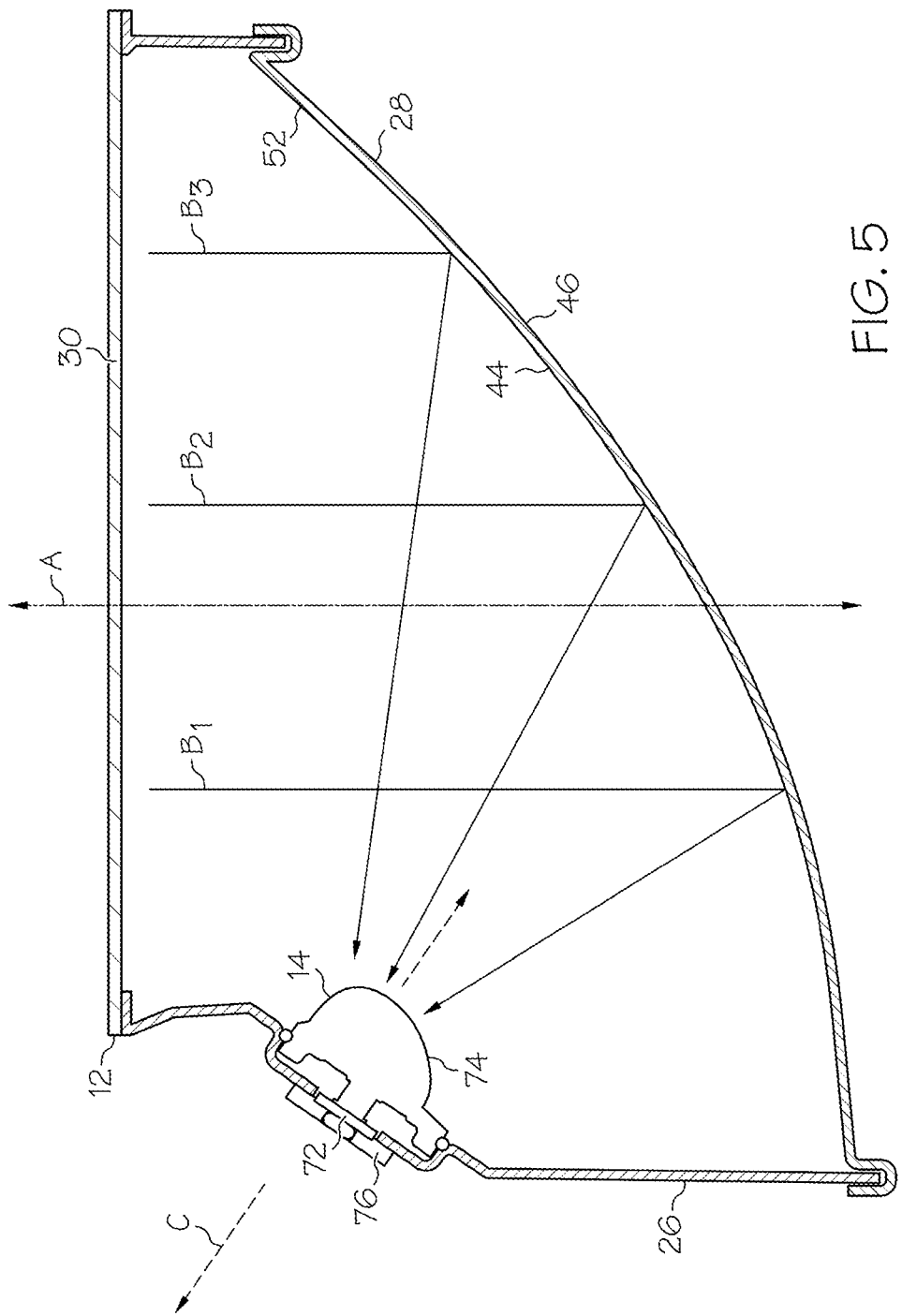
FIG. 5 is a side elevational view, in section, of the solar concentrator of FIG. 4.

In one specific aspect, the primary optical elements 52, 54, 56, 58, 60, 62 defined by the reflecting wall 28 may be sized, shaped and sufficiently reflective to receive incoming sunlight and focus the incoming sunlight onto the associated receivers 14, 16, 18, 20, 22, 24, as shown by the arrows $B_1$, $B_2$, $B_3$ in FIG. 5. For example, as shown in FIGS. 2, 3 and 5, the primary optical elements 52, 54, 56, 58, 60, 62 may be formed as an array of parabolic contours in the reflecting wall 28.

Figure 6B:
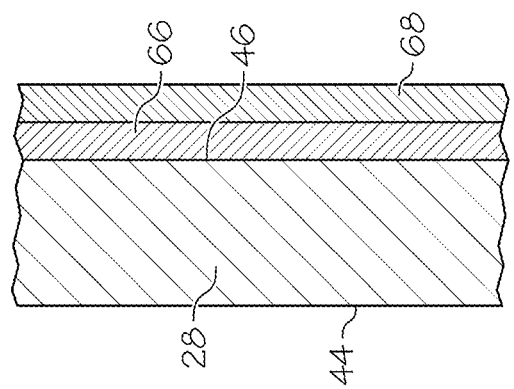
FIG. 6B is a side elevational view, in section, of a portion of the reflecting wall of the solar concentrator of FIG. 5 in accordance with a second implementation of the disclosure.
Figure 6A:
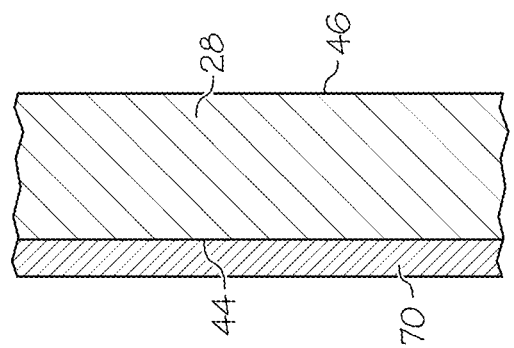
FIG. 6A is a side elevational view, in section, of a portion of the reflecting wall of the solar concentrator of FIG. 5 in accordance with a first implementation of the disclosure.

Referring to FIG. 6A, in a first implementation of the first aspect, the primary optical elements 52, 54, 56, 58, 60, 62 defined by the reflecting wall 28 may be rendered reflective by coating the external surface 46, or at least a portion of the external surface 46, of the reflecting wall 28 with a layer 66 of reflective material. Optionally, a protective overcoat layer 68 may be positioned over the reflective layer 66 to minimize oxidation and other environmental effects. In accordance with the first implementation, the reflecting wall 28 may be constructed from a material that is sufficiently optically clear, such as clear acrylic, such that incoming sunlight may pass through the reflecting wall 28 before being redirected by the reflective layer 66.

Referring to FIG. 6B, in a second implementation of the first aspect, the primary optical elements 52, 54, 56, 58, 60, 62 defined by the reflecting wall 28 may be rendered reflective by coating the internal surface 44, or at least a portion of the internal surface 44, of the reflecting wall 28 with a layer 70 of reflective material.

Those skilled in the art will appreciate that the reflective layers 66, 70 of the reflecting wall 28 may be formed using various techniques, including optical coatings (e.g., mirror coatings), films, decals or the like. For example, silver-based, aluminum-based, gold-based or platinum-based mirror coatings may be used, and may be deposited using various known techniques, such as ion-assisted deposition or sputtering. A specific example of a commercially available reflective material that may be used for layer 66 or layer 70 is ECI #800P mirror coating for plastic optical components, available from Evaporated Coatings, Inc. of Willow Grove, Pa.

In accordance with a second aspect, the reflecting wall 28 may be contoured to support separate optical elements (not shown), such as parabolic glass mirrors. The overall size and shape of the reflecting wall 28 may be formed such that the reflecting wall 28 receives and supports the separate optical elements in precise alignment with the receivers 14, 16, 18, 20, 22, 24. In one example, various tabs, clips and/or detents may be used to ensure proper positioning and alignment of the separate optical elements in the housing 12. In another example, a snap-fit-type connection between the reflecting wall 28 and the separate optical elements may be used. In yet another example, an adhesive, tape or fused connection between the reflecting wall 28 and the separate optical elements may be used.

Figure 4:
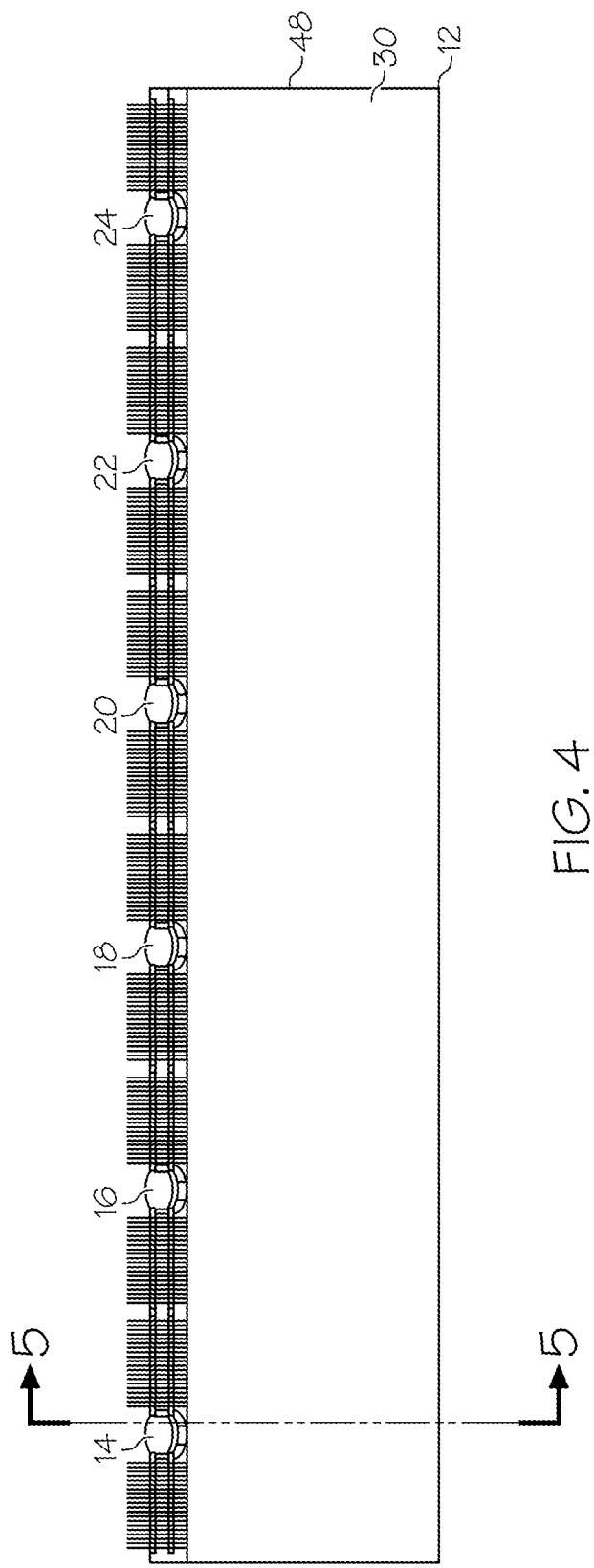
FIG. 4 is a top plan view of the solar concentrator of FIG. 1, shown in a fully assembled configuration.

As shown in FIG. 4, the cover 30 may be connected to the lip 48 defined by the receiving wall 26 and the reflecting wall 28 to seal the opening 50 (FIG. 2) into the internal volume 32 of the housing 12, thereby creating a rigid structure that ensures proper optical alignment between the receiving and reflecting walls 26, 28. The cover 30 may be secured to the lip 48 of the housing 12 by adhesives, tape (e.g., double-sided tape) or mechanical fasteners. Optionally, a gasket (not shown) may be positioned between the cover and the lip 48 to ensure a water-tight seal therebetween. The cover 30 may be a generally planar sheet of transparent or partially transparent material. In one example, the cover 30 may be formed from a polymeric material, such as polycarbonate or acrylic, or a combination of polymeric materials. In another example, the cover 30 may be formed from glass, and may be attached to the lip 48 in a design consideration that compensates for mismatch in thermal coefficients of expansion between dissimilar materials. The transparency, flexibility and weatherability of the material (or materials) used to form the cover 30 may be selected based upon design considerations.

Still referring to FIG. 4, the receivers 14, 16, 18, 20, 22, 24 may be mounted on, and may extend in a row across, the elongated wall 34 of the receiving wall 26. While six receivers 14, 16, 18, 20, 22, 24 are shown, those skilled in the art will appreciate that solar concentrators may be constructed with fewer or more receivers without departing from the scope of the present disclosure.

Referring now to FIG. 5, each receiver 14, 16, 18, 20, 22, 24 (only receiver 14 is shown in FIG. 5) may include one or more photovoltaic cells 72, a secondary optical element 74 (e.g., a lens) and a heat sink 76. If a cover 30 will not be used, then the photovoltaic cells 72 and the secondary optical element 74 may be sealed from the environment in a protective housing (not shown) or the like. The photovoltaic cells 72 may be any cells capable of converting light into electrical energy, such as silicon solar cells, GaAs solar cells or the like. The secondary optical elements 74 may focus harvested light, particularly light directed to the receivers 14, 16, 18, 20, 22, 24 by the primary optical elements 52, 54, 56, 58, 60, 62, onto the photovoltaic cells 72. The heat sink 76 may be any device capable of dissipating heat from the photovoltaic cells 72. In one example, the heat sink 76 may be a passive heat sink, such as a fanned heat sink, a heat pipe or the like. In another example, the heat sink 76 may be an active heat sink, such as an active cooling link with a moving heat transfer working fluid.

The receivers 14, 16, 18, 20, 22, 24 may be positioned on the receiving wall 26 such that a vertical axis C (i.e., an axis parallel with a surface normal of the photovoltaic cell) of the receivers 14, 16, 18, 20, 22, 24 is at a non-zero angle relative to the vertical axis A of the housing 12. Without being limited to any particular theory, it is believed that the off-axis configuration of the receivers 14, 16, 18, 20, 22, 24 may limit or prevent the obstruction of light (arrows $B_1$, $B_2$, $B_3$) entering the housing 12, and also provide for easier maintenance of the system.

In one aspect, the non-zero angle between the vertical axis C of the receivers 14, 16, 18, 20, 22, 24 and the vertical axis A of the housing 12 may be about 20 to about 80 degrees. In another aspect, the non-zero angle between the vertical axis C of the receivers 14, 16, 18, 20, 22, 24 and the vertical axis A of the housing 12 may be about 40 to about 70 degrees. In yet another aspect, the non-zero angle between the vertical axis C of the receivers 14, 16, 18, 20, 22, 24 and the vertical axis A of the housing 12 may be about 50 to about 60 degrees. In yet another aspect, the non-zero angle between the vertical axis C of the receivers 14, 16, 18, 20, 22, 24 and the vertical axis A of the housing 12 may be about 55 degrees.

Optionally, the solar concentrator 10 may include brackets or the like (not shown) connected to the housing 12 such that the solar concentrator 10 may be mounted to a solar tracker (not shown) or as part of a larger solar array comprised of multiple solar concentrators which would then be mounted to a solar tracker. The solar tracker may be configured to rotate the solar concentrator 10 such that the vertical axis A (FIG. 5) of the solar concentrator 10 is aligned with the sun as the sun moves across the sky.

Accordingly, the disclosed solar concentrator 10 has the advantages of a full enclosure and an off-axis configuration and, using advanced manufacturing techniques (e.g., plastic forming techniques), can be quickly and cost-effectively constructed using relatively few parts. Manufacturing costs and efficiencies (e.g., fewer parts to assembly) can be even further improved by incorporating the primary optical elements 52, 54, 56, 58, 60, 62 directly into the reflecting wall 28 of the housing 12 using, for example, optical mirror coatings. For example, a housing of the disclosed solar concentrator may be constructed from three parts, and the three parts may be self-fixturing to automatically align the optical elements.

Although various aspects of the disclosed solar concentrator have been shown and described, modifications may occur to those skilled in the art upon reading the specification. The present application includes such modifications and is limited only by the scope of the claims.

What is claimed is:

1. A method of making a solar concentrator, the method comprising:

forming a receiving wall from a polymeric material with a reflective material incorporated therein for protection from exposure to concentrated sunlight, the receiving wall having an elongated wall, a first side wall extending from a first end of the elongated wall, and a second side wall extending from a second end of the elongated wall;

forming a reflecting wall from an optically clear material and having a parabolic contour;

attaching the receiving wall to the reflecting wall to form a housing having an internal volume with an opening into the internal volume, the opening having a vertical axis, such that the first side wall and the second side wall of the receiving wall are connected to the reflecting wall;

forming a lip on the receiving wall and the reflecting wall;

attaching a cover to the receiving wall and the reflecting wall at the lip to seal the opening into the internal volume, thereby creating a rigid structure; and mounting at least one receiver having at least one photovoltaic cell on the elongated wall of the receiving wall to receive solar radiation entering the housing through the opening and reflected by the receiving wall, the receiver having an axis parallel with a surface normal of the photovoltaic cell, such that the axis is disposed at a non-zero angle relative to the vertical axis of the opening.

2. The method of claim 1, wherein forming the receiving wall includes forming the receiving wall from a polymeric material selected from polyethylene, polycarbonate, acrylic, and combinations thereof.

3. The method of claim 1, wherein forming the reflecting wall includes forming the reflecting wall from a polymeric material selected from polyethylene, polycarbonate, acrylic, and combinations thereof.

4. The method of claim 1, wherein forming the receiving wall includes forming the receiving wall with the reflective material including titanium dioxide.

5. The method of claim 1, further comprising mounting a light shield on an inside surface of the receiving wall.

6. The method of claim 1, further comprising forming the cover from a material selected from a polymeric material and glass.

7. The method of claim 1, further comprising securing the cover to the lip by a selected one of adhesives, tape, mechanical fasteners, and combinations thereof.

8. The method of claim 1, forming the reflecting wall includes forming the reflecting wall to define at least one primary optical element having the parabolic contour.

9. The method of claim 8, wherein forming the reflecting wall to define at least one primary optical element includes forming the reflecting wall to define at least one primary optical element having the parabolic contour.

10. The method of claim 1, wherein forming the reflecting wall includes forming the reflective wall by layering a reflective material on an internal surface thereof.

11. The method of claim 1, wherein forming the reflecting wall includes forming the reflecting wall by layering a reflective material on an external surface thereof.

12. The method of claim 1, wherein forming the reflecting wall includes coating a reflective material on an external surface thereof such that sunlight entering the internal volume passes through the reflecting wall and is reflected by the coating back through the reflecting wall into the internal volume to the receiver, and wherein the reflective material is a mirror coating.

13. The method of claim 1, wherein mounting at least one receiver includes providing the receiver with a lens focused on the photovoltaic cell.

14. The method of claim 1, wherein mounting the at least one receiver includes providing a heat sink thermally coupled with the photovoltaic cell.

15. The method of claim 1, wherein mounting the at least one receiver includes disposing the axis of the receiver at a non-zero angle of about 20 to about 80 degrees.

16. A method of making a solar concentrator, the method comprising:
forming a receiving wall from a polymeric material with a reflective material incorporated therein for protection from exposure to concentrated sunlight, the receiving wall having an elongated wall, a first side wall extending from a first end of the elongated wall, and a second side wall extending from a second end of the elongated wall;
forming a reflecting wall from an optically clear material, the reflecting wall having a parabolic contour and defining a plurality of primary optical elements;
forming a modular housing by attaching the first side wall and the second side wall of the receiving wall to the reflecting wall to define an elongated trough having an internal volume with an opening into the internal volume, the opening having a vertical axis;
forming an upper lip on the elongated housing surrounding the opening into the internal volume;
providing a cover attached to the receiving wall and the reflecting wall at the upper lip to seal the opening into the internal volume, thereby creating a rigid structure; and
mounting an array of receivers on the elongated wall to receive solar radiation entering the housing through the opening and reflected by the plurality of primary optical elements, each receiver of the array of receivers having an axis parallel with a surface normal of the receiver, such that the axis is disposed at a non-zero angle relative to the vertical axis of the opening.

17. The method of claim 16, wherein forming a reflecting wall includes positioning reflective material on one of an external surface of the reflecting wall or an internal surface of the reflecting wall.

18. The method of claim 16, wherein forming the receiving wall and forming the reflecting wall each includes forming from a polymeric material using a process selected from an injection molding process and a vacuum forming process.

19. The method of claim 16, wherein forming the receiving wall and forming the reflecting wall each includes forming from sheet metal using a process selected from a deep draw process and a stamping process plus a break form process.

\* \* \* \* \*